US010391863B2

(12) United States Patent
Takagi et al.

(10) Patent No.: US 10,391,863 B2
(45) Date of Patent: Aug. 27, 2019

(54) ELECTRICALLY DRIVEN VEHICLE

(71) Applicant: TOYOTA JIDOSHA KABUSHIKI KAISHA, Toyota-shi, Aichi-ken (JP)

(72) Inventors: Kensuke Takagi, Toyota (JP); Tomoko Oba, Toyota (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 0 days.

(21) Appl. No.: 16/229,117

(22) Filed: Dec. 21, 2018

(65) Prior Publication Data

US 2019/0193564 A1 Jun. 27, 2019

(30) Foreign Application Priority Data

Dec. 26, 2017 (JP) ................. 2017-248882

(51) Int. Cl.
| | |
|---|---|
| *G01R 31/00* | (2006.01) |
| *B60L 3/00* | (2019.01) |
| *H02H 7/122* | (2006.01) |
| *H02P 29/024* | (2016.01) |
| *H02P 29/032* | (2016.01) |
| *G01R 31/02* | (2006.01) |

(52) U.S. Cl.
CPC ........... *B60L 3/003* (2013.01); *H02H 7/1227* (2013.01); *H02P 29/027* (2013.01); *H02P 29/032* (2016.02); *G01R 31/025* (2013.01)

(58) Field of Classification Search
CPC ...... B60L 3/0023; B60L 3/0069; B60L 3/003; H02P 29/032; H02P 29/0027

USPC ......... 318/443, 504, 400.02, 400.03, 400.13, 318/400.22; 324/503, 509, 528, 547, 713, 324/772
See application file for complete search history.

(56) References Cited

U.S. PATENT DOCUMENTS

| | | | | | |
|---|---|---|---|---|---|
| 5,686,839 | A | * | 11/1997 | Takagi | B60L 3/0023 324/503 |
| 7,372,677 | B2 | * | 5/2008 | Kishibata | H02J 7/1438 361/42 |
| 8,598,826 | B2 | * | 12/2013 | Danjo | B60L 3/003 318/453 |
| 9,742,337 | B2 | * | 8/2017 | Sunahara | B60L 7/14 |
| 2009/0195199 | A1 | | 8/2009 | Ito | |
| 2015/0318796 | A1 | * | 11/2015 | Dent | H02M 7/53871 363/97 |

FOREIGN PATENT DOCUMENTS

| | | |
|---|---|---|
| JP | 2006-228058 A | 8/2006 |
| JP | 2008-54420 A | 3/2008 |
| JP | 2016-165180 A | 9/2016 |
| JP | 2016-226132 A | 12/2016 |

* cited by examiner

*Primary Examiner* — Rajnikant B Patel
(74) *Attorney, Agent, or Firm* — Sughrue Mion, PLLC

(57) ABSTRACT

When ignition is on, a shift position is a neutral position, and shut-down of the inverter is cancelled in a state that a short circuit fault occurs in any phase among multiple phases of the inverter, the electrically driven vehicle performs a first ON control to turn on upper and lower arms in any arbitrary phase among the multiple phases. When an abnormality is detected in the inverter due to the first ON control, the electrically driven vehicle performs a second ON control to turn on upper and lower arms in a different phase from the phase of the first ON control.

2 Claims, 4 Drawing Sheets

ELECTRICALLY DRIVEN VEHICLE

CROSS-REFERENCE TO RELATED APPLICATIONS

The present disclosure claims priority to Japanese Patent Application No. 2017-248882 filed Dec. 26, 2017, which is incorporated herein by reference in its entirety including specification, drawings and claims.

TECHNICAL FIELD

The present disclosure relates to an electrically driven vehicle and more specifically relates to an electrically driven vehicle including a motor configured to input and output a power for driving, an inverter configured to drive the motor, and a control device configured to shut down the inverter in response to detection of a short circuit fault of the inverter.

BACKGROUND

In the event of a short circuit fault occurring in any phase of an inverter that is used to drive a motor, a proposed configuration of an electrically driven vehicle identifies the phase having a short circuit fault and performs an ON control to turn on upper and lower arms in the identified phase (as described in, for example, JP 2008-54420A). When a short circuit fault occurs in any phase of the inverter, this electrically driven vehicle identifies a short circuit phase, based on a motor current input from a current sensor. This electrically driven vehicle then turns on the upper and the lower arms in the identified short circuit phase and thereby causes a short circuit fault of transistor elements (IGBT elements) that form the upper and lower arms in the short circuit phase. This suppresses the overcurrent in the inverter and a power line due to a back electromotive force generated by the motor during towing of the vehicle.

SUMMARY

In the electrically driven vehicle described above, however, when the motor has a low rotation speed and thereby generates a small back electromotive force, there may be a difficulty in identifying a short circuit phase in the event of a short circuit fault occurring in any phase of the inverter. When a short circuit occurs between a base and an emitter of a short circuit transistor element (IGBT element), turning on the upper and the lower arms in the short circuit phase is likely to detect an abnormality due to a failure in applying a voltage to the base and to shut down the inverter.

A main object of an electrically driven vehicle of the present disclosure is to reliably perform an ON control to turn on both upper and lower arms in any arbitrary phase without identifying the phase having a short circuit, when a short circuit fault occurs in any phase of an inverter.

In order to achieve the above primary object, the electrically driven vehicle of the present disclosure employs the following configuration.

The present disclosure is directed to an electrically driven vehicle. The electrically driven vehicle includes a motor configured to input and output a power for driving, an inverter configured to drive the motor, a power storage device configured to supply electric power to the inverter and a control device configured to shut down the inverter in response to detection of a short circuit fault of the inverter. When ignition is on, a shift position is a neutral position, and shut-down of the inverter is cancelled in a state that a short circuit fault occurs in any phase among multiple phases of the inverter, the control device performs a first ON control to turn on upper and lower arms in any arbitrary phase among the multiple phases. When an abnormality is detected in the inverter due to the first ON control, the control device performs a second ON control to turn on upper and lower arms in a different phase from the phase of the first ON control.

When a short circuit fault is detected in the inverter, the electrically driven vehicle of this aspect shuts down the inverter. When ignition is on, the shift position is a neutral position, and shut-down of the inverter is cancelled in the state that a short circuit fault occurs in any phase among the multiple phases of the inverter, the electrically driven vehicle performs the first ON control to turn on the upper and lower arms in any arbitrary phase among the multiple phases. When an abnormality is detected in the inverter due to the first ON control, the electrically driven vehicle performs the second ON control to turn on the upper and lower arms in the different phase from the phase of the first ON control. In other words, when no abnormality is detected in the inverter due to the first ON control, the first ON control is continued. When an abnormality is detected in the inverter due to the first ON control, on the other hand, the second ON control is performed. This configuration reliably performs the ON control to turn on both the upper and lower arms in any arbitrary phase without identifying the phase having a short circuit, when a short circuit fault occurs in any phase of an inverter.

DESCRIPTION OF EMBODIMENTS

The following describes some aspects of the disclosure with reference to embodiments.

Figure 1:
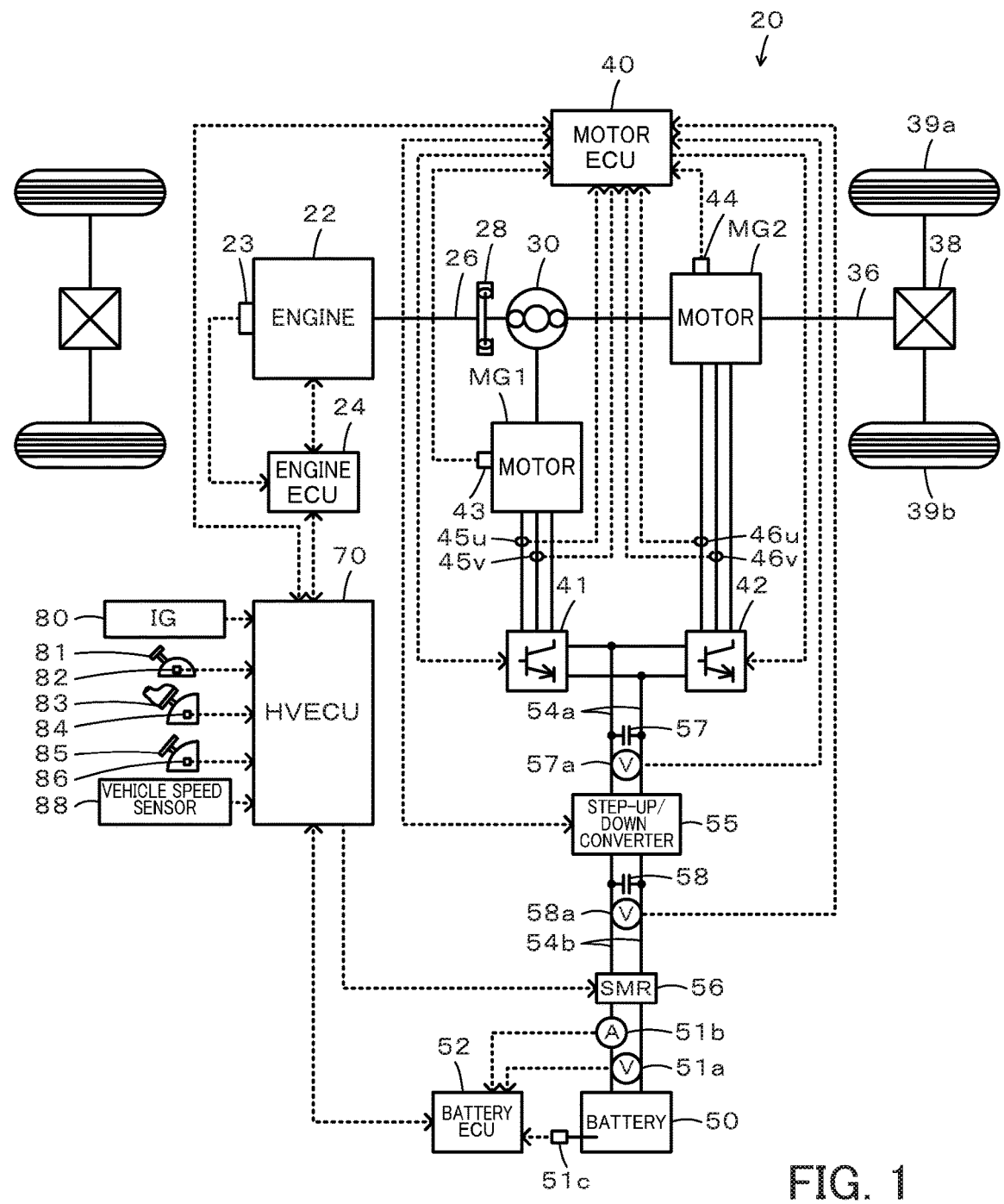
FIG. 1 is a configuration diagram illustrating the schematic configuration of a hybrid vehicle according to one embodiment of the present disclosure.
Figure 2:
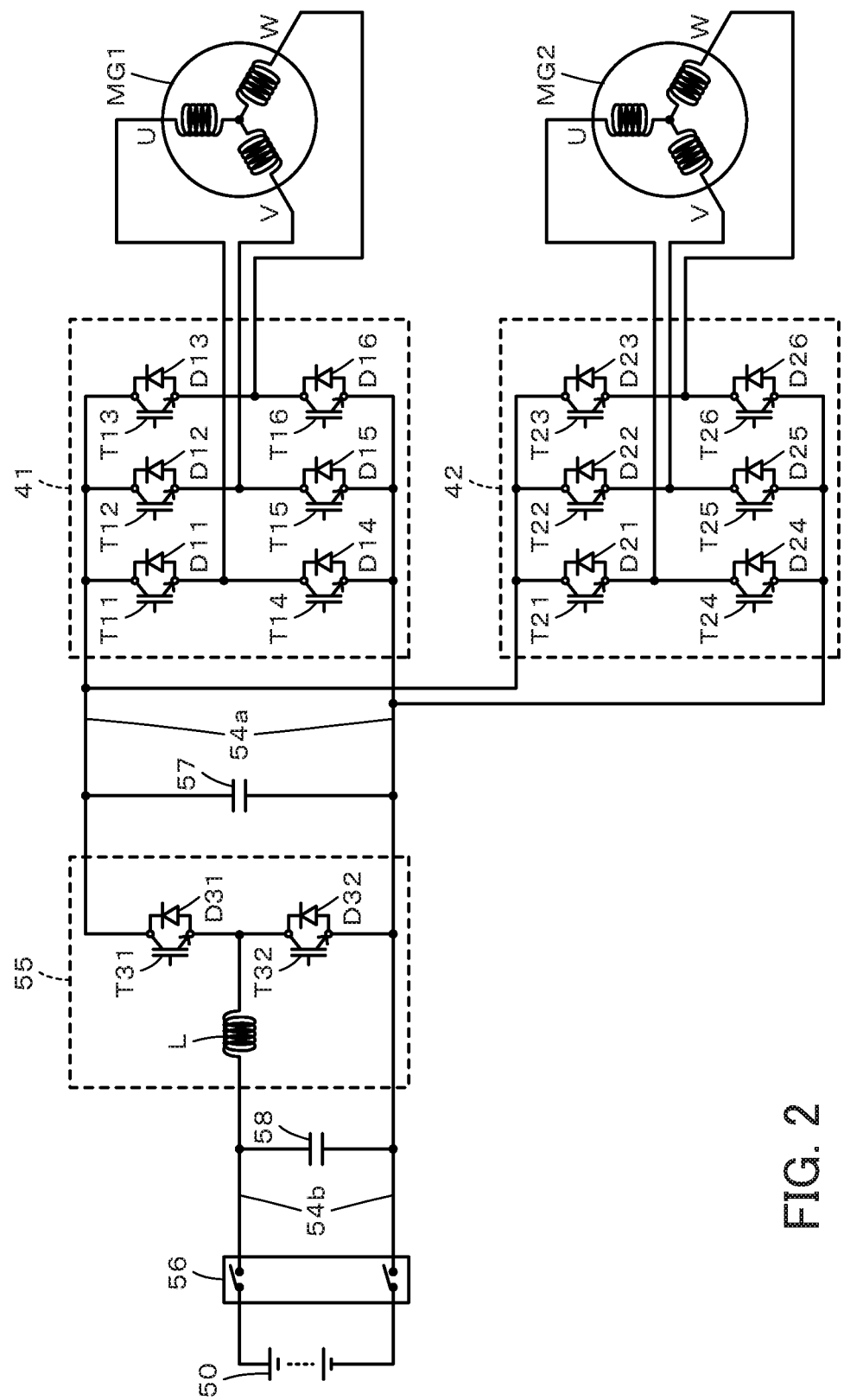
FIG. 2 is a configuration diagram illustrating the schematic configuration of an electrical driving system including motors MG1 and MG2.

FIG. 1 is a configuration diagram illustrating the schematic configuration of a hybrid vehicle 20 according to one embodiment of the present disclosure. FIG. 2 is a configuration diagram illustrating the schematic configuration of an electrical driving system including motors MG1 and MG2. As illustrated, the hybrid vehicle 20 of the embodiment includes an engine 22, a planetary gear 30, motors MG1 and MG2, inverters 41 and 42, a step-up/down converter 55, a battery 50 serving as a power storage device, a system main relay 56, and a hybrid electronic control unit (hereinafter referred to as "HVECU") 70.

The engine 22 is configured as an internal combustion engine that outputs power using, for example, gasoline or light oil as a fuel and is connected with a carrier of the planetary gear 30 via a damper 28. This engine 22 is operated and controlled by an engine electronic control unit (hereinafter referred to as "engine ECU") 24.

The engine ECU 24 is configured as a CPU-based microprocessor and includes a ROM configured to store processing programs, a RAM configured to temporarily store data, input/output ports and a communication port, in addition to the CPU, although not being illustrated. Signals from various sensors required for operation control of the engine 22, for example, a crank angle θcr from a crank position sensor 23 configured to detect the rotational position of a crankshaft 26 of the engine 22, are input into the engine ECU 24 via the input port. Various control signals for operation control of the engine 22 are output from the engine ECU 24 via the output port. The engine ECU 24 is connected with the HVECU 70 via the respective communication ports. The engine ECU 24 calculates a rotation speed Ne of the engine 22, based on the crank angle θcr input from the crank position sensor 23.

The planetary gear 30 is configured as a single pinion-type planetary gear mechanism. The planetary gear 30 includes a sun gear that is connected with a rotor of the motor MG1. The planetary gear 30 also includes a ring gear that is connected with a driveshaft 36 linked with drive wheels 39a and 39b via a differential gear 38. The planetary gear 30 also includes a carrier that is connected via a damper 28 with the crankshaft 26 of the engine 22, as described above.

The motor MG1 is configured as a synchronous motor generator having a rotor with permanent magnets embedded therein and a stator with three-phase coils wound thereon and includes the rotor that is connected with the sun gear of the planetary gear 30 as described above. The motor MG2 is also configured as a synchronous motor generator like the motor MG1 and includes a rotor that is connected with the driveshaft 36.

The inverters 41 and 42 are used to drive the motors MG1 and MG2. As shown in FIG. 2, the inverter 41 is connected with high voltage-side power lines 54a and includes six transistors T11 to T16 serving as switching elements and six diodes D11 to D16 that are respectively connected in parallel to the six transistors T11 to T16. The transistors T11 to T16 are arranged in pairs, such that two transistors in each pair respectively serve as a source and as a sink relative to a positive electrode line and a negative electrode line of the high voltage-side power lines 54a. The respective phases of the three-phase coils (U phase, V phase and W phase) of the motor MG1 are connected with connection points of the respective pairs of the transistors T11 to T16. Accordingly, when a voltage is applied to the inverter 41, a motor electronic control unit (hereinafter referred to as "motor ECU") 40 regulates the rates of ON times of the respective pairs of the transistors T11 to T16 to provide a rotating magnetic field in the three-phase coils and thereby rotate and drive the motor MG1. Like the inverter 41, the inverter 42 is also connected with the high voltage-side power lines 54a and includes six transistors T21 to T26 and six diodes D21 to D26. When a voltage is applied to the inverter 42, the motor ECU 40 regulates the rates of ON times of the respective pairs of the transistors T21 to T26 to provide a rotating magnetic field in the three-phase coils and thereby rotate and drive the motor MG2.

The step-up/down converter 55 is connected with the high voltage-side power lines 54a and with low voltage-side power lines 54b and includes two transistors T31 and T32 serving as switching elements, two diodes D31 and D32 that are respectively connected in parallel to the two transistors T31 and T32, and a reactor L. The transistor T31 is connected with the positive electrode line of the high voltage-side power lines 54a. The transistor T32 is connected with the transistor T31 and with negative electrode lines of the high voltage-side power lines 54a and of the low voltage-side power lines 54b. The reactor L is connected with a connection point between the transistors T31 and T32 and with a positive electrode line of the low voltage-side power lines 54b. The motor ECU 40 regulates the rates of ON times of the transistors T31 and T32, such that the step-up/down converter 55 steps up the voltage of an electric power on the low voltage-side power lines 54b and supplies the electric power of the stepped-up voltage to the high voltage-side power lines 54a, while stepping down the voltage of an electric power on the high voltage-side power lines 54a and supplying the electric power of the stepped-down voltage to the low voltage-side power lines 54b, accompanied with regulation of a voltage VH of the high voltage-side power lines 54a. A capacitor 57 for smoothing is mounted to the positive electrode line and the negative electrode line of the high voltage-side power lines 54a. A capacitor 58 for smoothing is mounted to the positive electrode line and the negative electrode line of the low voltage-side power lines 54b.

The motor ECU 40 is configured as a CPU-based microprocessor and includes a ROM configured to store processing programs, a RAM configured to temporarily store data, input/output ports and a communication port, in addition to the CPU, although not being illustrated. As shown in FIG. 1, signals from various sensors required for drive control of the motors MG1 and MG2 and the step-up/down converter 55 are input into the motor ECU 40 via the input port. The signals input into the motor ECU 40 include, for example, rotational positions θm1 and θm2 from rotational position detection sensors 43 and configured to detect the rotational positions of the respective rotors of the motors MG1 and MG2 and phase currents Iu1, Iv1, Iu2 and Iv2 from current sensors 45u, 45v, 46u and 46v configured to detect electric currents flowing in the respective phases of the motors MG1 and MG2. The input signals also include a voltage (high voltage-side voltage) VH of the capacitor 57 (high voltage-side power lines 54a) from a voltage sensor 57a placed between terminals of the capacitor 57 and a voltage (low voltage-side voltage) VL of the capacitor 58 (low voltage-side power lines 54b) from a voltage sensor 58a placed between terminals of the capacitor 58. Various control signals for drive control of the motors MG1 and MG2 and the step-up/down converter 55 are output from the motor ECU 40 via the output port. The signals output from the motor ECU 40 include, for example, switching control signals to the transistors T11 to T16 of the inverter 41 and the transistors T21 to T26 of the inverter 42 and switching control signals to the transistors T31 and T32 of the step-up/down converter 55. The motor ECU is connected with the HVECU 70 via the respective communication ports. The motor ECU 40 calculates electrical angles θe1 and θe2, angular velocities ωm1 and ωm2 and rotation speeds Nm1 and Nm2 of the respective motors MG1 and MG2, based on the rotational positions θm1 and θm2 of the respective rotors of the motors MG1 and MG2 input from the rotational position detection sensors 43 and 44.

The battery 50 is configured by, for example, a lithium ion rechargeable battery or a nickel metal hydride battery having a rated voltage of, for example, 200V and is connected with the low voltage-side power lines 54b. This battery 50 is under management of a battery electronic control unit (hereinafter referred to as "battery ECU") 52.

The battery ECU 52 is configured as a CPU-based microprocessor and includes a ROM configured to store processing programs, a RAM configured to temporarily store data, input/output ports and a communication port, in addition to the CPU, although not being illustrated. Signals from various sensors required for management of the battery 50 are input into the battery ECU 52 via the input port. The signals input into the battery ECU 52 include, for example, a voltage Vb of the battery 50 from a voltage sensor 51a placed between terminals of the battery 50, an electric current Ib of the battery 50 from a current sensor 51b mounted to an output terminal of the battery 50, and a temperature Tb of the battery 50 from a temperature sensor 51c mounted to the battery 50. The battery ECU 52 is connected with the HVECU 70 via the respective communication ports. The battery ECU 52 calculates a state of charge SOC, based on an integrated value of the electric current Ib of the battery 50 input from the current sensor 51b. The state of charge SOC denotes a ratio of the capacity of electric power dischargeable from the battery 50 to the overall capacity of the battery 50.

The system main relay 56 is provided on the battery 50-side of the capacitor 58 in the low voltage-side power lines 54b. This system main relay 56 is controlled on and off by the HVECU 70 to connect and disconnect the battery 50 with and from the step-up/down converter 55-side.

The HVECU 70 is configured as a CPU-based microprocessor and includes a ROM configured to store processing programs, a RAM configured to temporarily store data, input/output ports and a communication port, in addition to the CPU, although not being illustrated. The HVECU 70 obtains signals input from various sensors via the input port. The signals input into the HVECU 70 include, for example, an ignition signal from an ignition switch 80 and a shift position SP from a shift position sensor 82 configured to detect an operating position of a shift lever 81. The input signals further include, for example, an accelerator position Acc from an accelerator pedal position sensor 84 configured to detect a depression amount of an accelerator pedal 83, a brake pedal position BP from a brake pedal position sensor 86 configured to detect a depression amount of a brake pedal 85, and a vehicle speed V from a vehicle speed sensor 88. Examples of the shift position SP include a parking position (P position), a reverse position (R position), a neutral position (N position), a drive position (D position) and a brake position (B) position. The B position provides an equivalent driving force in an accelerator-on time to the driving force at the D position, while providing a larger braking force in an accelerator-off time than the braking force at the D position. The HVECU 70 is connected with the engine ECU 24, the motor ECU 40 and the battery ECU 52 via the respective communication ports as described above.

The hybrid vehicle 20 of the embodiment having the above configuration sets a required driving power for the driveshaft 36 based on the accelerator position Acc and the vehicle speed V and performs operation control of the engine 22 and the motors MG1 and MG2 so as to output a required power that meets the required driving power to the driveshaft 36. The hybrid vehicle 20 has the following three modes (1) to (3) as the operation mode of the engine 22 and the motors MG1 and MG2:

(1) torque conversion drive mode: mode that performs operation control of the engine 22 so as to output a power corresponding the required power from the engine 22, while performing drive control of the motors MG1 and MG2 so as to cause all the power output from the engine 22 to be subjected to torque conversion by the planetary gear 30 and the motors MG1 and MG2 and thereby output the required power to the driveshaft 36;

(2) charge-discharge drive mode: mode that performs operation control of the engine 22 so as to output a power that meets the sum of the required power and electric power required for charging or discharging the battery 50, from the engine 22, while performing drive control of the motors MG1 and MG2 so as to cause all the power or part of the power output from the engine 22 to be subjected to torque conversion by the planetary gear 30 and the motors MG1 and MG2 accompanied with charging or discharging of the battery 50 and thereby output the required power to the driveshaft 36; and (3) motor drive mode: mode that performs drive control of the motor MG2 so as to output the required power to the driveshaft 36, while stopping the operation of the engine 22.

In the event of an abnormality occurring in any of the inverters 41 and 42 and the sensors used for control of the inverters 41 and 42 (for example, the current sensors 45u, 45v, 46u and 46v), for example, in the event of a short circuit fault in any of the phases of the inverters 41 and 42, the hybrid vehicle 20 of the embodiment shuts down the inverters 41 and 42 (turns off all the transistors T11 to T16 and T21 to T26) and stores the fault as a record in a predetermined area of a flash memory (not shown) of the HVECU 70. At the time of an emergency drive or at the time of towing, a shut-down cancellation signal is set ON to cancel the shut-down of the inverters 41 and 42.

Figure 3:
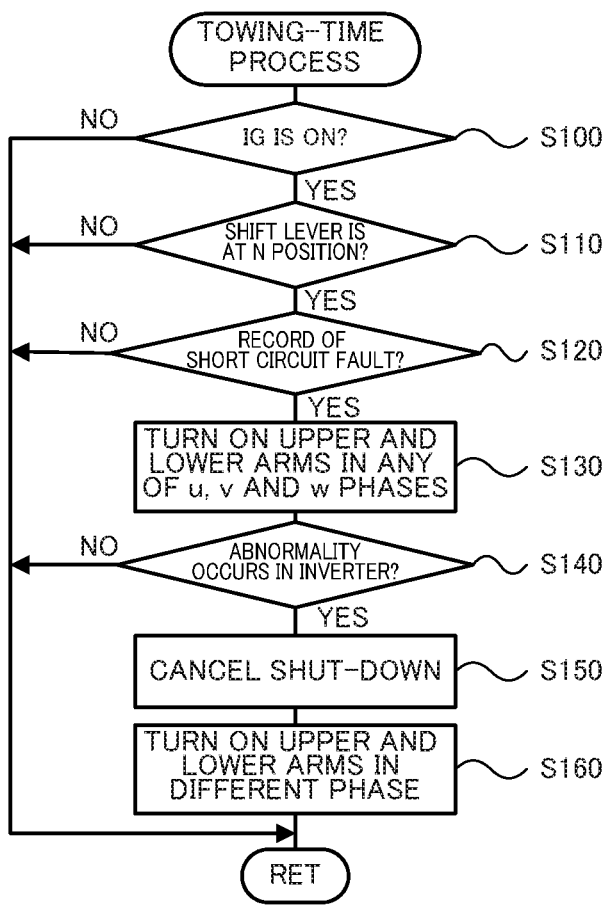
FIG. 3 is a flowchart showing one example of a towing-time process routine performed by the HVECU.

The following describes the operations of the hybrid vehicle 20 of the embodiment having the configuration described above or more specifically a series of operations when the hybrid vehicle 20 is towed in the event of a short circuit fault occurring in any of the u, v and w phases of the inverter 42 that is used to drive the motor MG2. FIG. 3 is a flowchart showing one example of a towing-time process routine performed by the HVECU 70. The towing-time process is performed when the hybrid vehicle 20 is towed in the event of a short circuit fault occurring in any of the u, v and w phases of the inverter 42 that is used to drive the motor MG2.

When the towing-time process routine is triggered, the HVECU 70 sequentially determines whether the ignition switch is ON (step S100), whether the shift lever 81 is at the N position (step S110), and whether there is any record of a short circuit fault occurring in the inverter 42 that is used to drive the motor MG2 (step S120). When the ignition switch is not ON, the inverters 41 and 42 and the like are uncontrollable. The HVECU 70 accordingly fails to perform any further processing. When the shift lever 81 is not at the N position, the shift position is unsuitable for towing. The HVECU 70 accordingly fails to perform any further processing. When there is no record of a short circuit fault occurring in the inverter 42 that is used to drive the motor MG2, there is no need for any further processing. The presence or the absence of the record of a short circuit fault is determined by reading the storage in the predetermined area of the flash memory (not shown) of the HVECU 70. When it is determined that the ignition switch is not ON, when it is determined that the shift lever 81 is not at the N position, or when it is determined that there is no record of a short circuit fault occurring in the inverter 42 that is used to drive the motor MG2, the HVECU 70 terminates this routine without performing any further processing.

When it is determined that the ignition switch is ON, it is determined that the shift lever 81 is at the N position and it is determined that there is a record of a short circuit fault occurring in the inverter 42 that is used to drive the motor MG2, on the other hand, the HVECU 70 performs a first ON control to turn on transistors that forms upper and lower arms in any of the u, v, w phases (any arbitrary phase) of the inverter 42 (step S130). The HVECU 70 subsequently determines whether an abnormality occurs in the inverter due to the ON operation of the transistors that form the upper and lower arms of any arbitrary phase (step S140). The transistor with a short circuit fault may have a short circuit fault between the base and the emitter. In this state, even when a voltage is to be applied to the base in order to turn on the transistor with a short circuit fault, the short circuit fault between the base and the emitter may fail to apply a voltage equal to or higher than a reference voltage to the base. In this case, a failure diagnosis (not shown) is performed to determine the occurrence of an abnormality in the inverter and shuts down the inverters 41 and 42. The HVECU 70 determines whether such an abnormality occurs in the inverter at step S140. When it is determined that no abnormality occurs in the inverter, the HVECU 70 determines that continuation of the first ON control is allowed and terminates this routine. Accordingly, this performs the ON control to turn on both the transistors that form the upper and lower arms in any one phase of the u, v, and w phases.

When it is determined at step S140 that an abnormality occurs in the inverter due to the ON operation of the transistors that form the upper and lower arms of any arbitrary phase, the HVECU 70 turns on a shut down cancellation signal to cancel the shut-down of the inverters 41 and 42 (step S150), performs a second ON control to turn on both transistors that form upper and lower arms in different one phase from that of the first ON control (step S160), and then terminates this routine. Accordingly, this performs the ON control to turn on both the transistors that form the upper and lower arms in any one phase of the u, v and w phases.

As described above, in the case where the hybrid vehicle 20 is towed after the occurrence of a short circuit fault in any of the u, v and w phases of the inverter 42 that is used to drive the motor MG2, when the ignition switch is ON, the shift lever 81 is at the N position and there is a record of a short circuit fault of the inverter 42 that is used to drive the motor MG2, the hybrid vehicle 20 of the embodiment performs the first ON control to turn on the transistors that form the upper and lower arms in any of the u, v and w phases (any arbitrary phase) of the inverter 42. When an abnormality occurs in the inverter due to the first ON control, the hybrid vehicle 20 of the embodiment cancels the shut-down of the inverters 41 and 42 and performs the second ON control to turn on the transistors that form the upper and lower arms in different one phase from that of the first ON control. In the event of a short circuit fault occurring in any of the u, v and w phases of the inverter 42 that is used to drive the motor MG2, this configuration reliably performs the ON control to turn on both the upper and lower arms in any one phase without identifying the phase having a short circuit.

The hybrid vehicle 20 of the embodiment includes the step-up/down converter 55. According to a modification, the hybrid vehicle may not include the step-up/down converter 55.

The hybrid vehicle 20 of the embodiment uses the battery 50 as the power storage device. The power storage device may, however, be any device configured to accumulate electricity, such as a capacitor.

The hybrid vehicle 20 of the embodiment includes the engine ECU 24, the motor ECU 40, the battery ECU 52 and the HVECU 70. At least two of these ECUS may be configured as a single electronic control unit.

Figure 4:
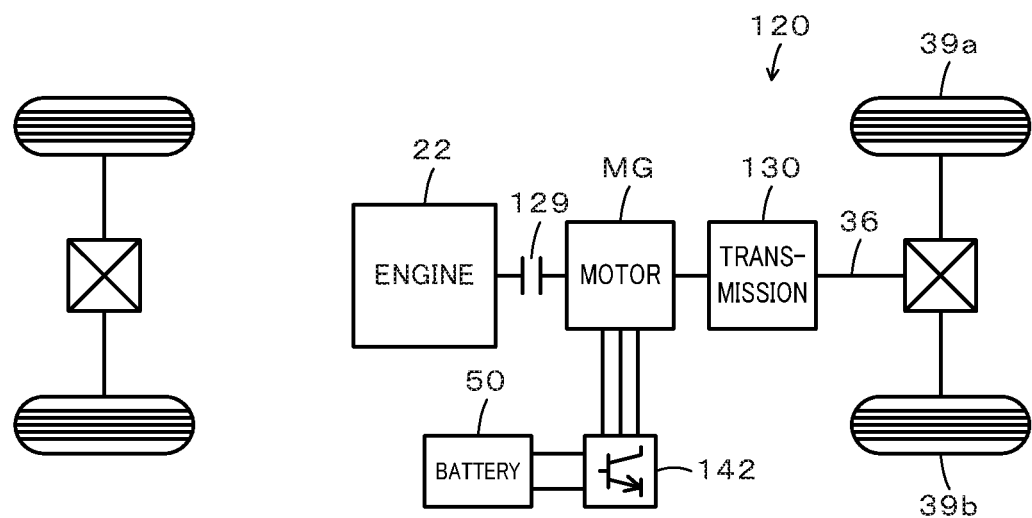
FIG. 4 is a configuration diagram illustrating the schematic configuration of another hybrid vehicle according to a modification.

According to the above embodiment, the hybrid vehicle 20 is configured such that the engine 22 and the motor MG1 are connected via the planetary gear 30 with the driveshaft 36 linked with the drive wheels 39a and 39b, that the motor MG2 is connected with the driveshaft 36, and that the motors MG1 and MG2 are driven by the inverters 41 and 42. The present disclosure may also be applied to a hybrid vehicle 120 according to a modification configured such that a motor MG is connected via a transmission 130 with a driveshaft 36 linked with drive wheels 39a and 39b, that an engine 22 is connected with the motor MG via a clutch 129, and that the motor MG is driven by an inverter 142 as shown in FIG. 4. The present disclosure may further be applied to the configuration of an electric vehicle without an engine.

In the hybrid vehicle of this aspect, the control device may shut down the inverter when an abnormality is detected in the inverter, and when an abnormality is detected in the inverter due to the first ON control, the control device may cancel the shut-down of the inverter and subsequently perform the second ON control to turn on the upper and lower arms in the different phase from the phase of the first ON control. This configuration reliably performs the second ON control.

The following describes the correspondence relationship between the primary components of the embodiment and the primary components of the disclosure described in Summary. The motor MG2 of the embodiment corresponds to the "motor", the inverter 42 corresponds to the "inverter", the battery 50 corresponds to the "power storage device", and the HVECU 70 and the motor ECU 40 correspond to the "control device".

The correspondence relationship between the primary components of the embodiment and the primary components of the disclosure, regarding which the problem is described in Summary, should not be considered to limit the components of the disclosure, regarding which the problem is described in Summary, since the embodiment is only illustrative to specifically describes the aspects of the disclosure, regarding which the problem is described in Summary. In other words, the disclosure, regarding which the problem is described in Summary, should be interpreted on the basis of the description in the Summary, and the embodiment is only a specific example of the disclosure, regarding which the problem is described in Summary.

The aspect of the disclosure is described above with reference to the embodiment. The disclosure is, however, not limited to the above embodiment but various modifications and variations may be made to the embodiment without departing from the scope of the disclosure.

INDUSTRIAL APPLICABILITY

The technique of the disclosure is preferably applicable to the manufacturing industries of the electrically driven vehicle and so on.

The invention claimed is:
1. An electrically driven vehicle, comprising:
a motor configured to input and output a power for driving;
an inverter configured to drive the motor;
a power storage device configured to supply electric power to the inverter; and
a control device configured to shut down the inverter in response to detection of a short circuit fault of the inverter, wherein
when ignition is on, a shift position is a neutral position, and shut-down of the inverter is cancelled in a state that a short circuit fault occurs in any phase among multiple phases of the inverter, the control device performs a first ON control to turn on upper and lower arms in any arbitrary phase among the multiple phases, and when an abnormality is detected in the inverter due to the first ON control, the control device performs a second ON control to turn on upper and lower arms in a different phase from the phase of the first ON control.

2. The electrically driven vehicle according to claim 1, wherein the control device shuts down the inverter when an abnormality is detected in the inverter, and when an abnormality is detected in the inverter due to the first ON control, the control device cancels the shutdown of the inverter and subsequently performs the second ON control to turn on the upper and lower arms in the different phase from the phase of the first ON control.

* * * * *